United States Patent [19]

Bhat et al.

[11] Patent Number: 5,541,949
[45] Date of Patent: * Jul. 30, 1996

[54] STRAINED ALGAINAS QUANTUM-WELL DIODE LASERS

[75] Inventors: Rajaram Bhat, Middletown; Chung-En Zah, Holmdel, both of N.J.

[73] Assignee: Bell Communications Research, Inc., Morristown, N.J.

[*] Notice: The term of this patent shall not extend beyond the expiration date of Pat. No. 5,381,434.

[21] Appl. No.: 380,427

[22] Filed: Jan. 30, 1995

[51] Int. Cl.$^6$ .................................................... H01S 3/19
[52] U.S. Cl. ............................................................ 372/45
[58] Field of Search ................................ 372/45, 46, 50, 372/43

[56] References Cited

U.S. PATENT DOCUMENTS 5,381,434  1/1995  Bhat et al. ................................. 372/45

OTHER PUBLICATIONS

Zah et al., "High–Performance Uncooled 1.3–μm Al$_x$Ga$_y$In$_{1-x-y}$/InP Strained–Layer Quantum–Well Lasers for Subscriber Loop Applications," *IEEE Journal of Quantum Electronics*, vol. 30, No. 2, Feb., 1994.

Bhat et al., "OMCVD growth of strained Al$_x$Ga$_y$In$_{1-x-y}$As for low threshold 1.3 μm and 1.55 μm quantum well lasers," *Proceedings of the Fourth International Conference on Indium Phosphide and Related Materials*, Apr. 21–24, 1992, Newport, Rhode Island, paper THD2, pp. 453–456.

Kasukawa et al., "Very low threshold current density 1.5 μm GaInAs/AlGaInAs graded–index separate–confinement-heterostructure strained quantum well laser diodes grown by organometallic vapor deposition." *Applied Physics Letters*, vol. 59, pp. 2486–2488, 1991 (Nov.).

Stegmüller et al., "1.57 μm Strained–Layer Quantum–Well GaInAlAs Ridge–Waveguide Laser Diodes with High Temperature (130 °C) Ultrahigh–Speed (17 GHz) Performance." in *IEEE Photonics Technology Letters*, vol. 5, pp. 597–598, 1993.

Vawter et al., "Useful design relationships for the engineering of thermodynamically stable strained–layer structures," *Journal of Applied Physics*, vol. 65, pp. 4769–4773, 1989 (Jan. 15).

Wang et al., "High speed, Ultra low Noise Operation from −40 °C to 100 °C Tensile Strained InGaAlAs MQW Lasers emitting at 1300 nm," *14th IEEE International Semiconductor Laser Conference*, Sep. 19–23, 1994, Maui, Hawaii, USA.

Van de Walle, "Band lineups and deformation potentials in the model–solid theory," *Physical Review B*, vol. 39, pp. 1871–1883, 1989 (Jan. 15).

Sugiyama et al., "Conduction Band Edge Discontinuity of In$_{0.52}$Ga$_{0.48}$As/In$_{0.54}$(Ga$_{1-x}$Al$_x$)$_{0.48}$As (0≤x≤1) Heterostructures," *Japanese Journal of Applied Physics*, vol. 25, 1986 (Aug.).

Mondry et al., "Low threshold current density 1.5 μm (In, Ga, Al)As quantum well lasers grown by MBE." *Electronics Letters*, vol. 28, pp. 1471–1472, 1992 (Jul.).

Tsang et al., "New current injection 1.5–μm wavelength Ga$_x$Al$_y$In$_{1-x-y}$As/InP double–heterostructure laser grown by molecular beam epitaxy," *Applied Physics Letters*, vol. 42, pp. 922–924, 1983 (Jun.).

Zah et al., "Low threshold 1.3 μm strained–layer Al$_x$Ga$_y$In$_{1-x-y}$As quantum well lasers," *Electronics Letters*. vol. 28, pp. 2323–2325, 1992 (Dec.).

Choi et al., "MBE–grown InGaAlAs 1.5 μm MQW ridge waveguide laser diodes with AlAs etch stop layers," *Electronics Letters*, vol. 29, pp. 483–485, 1993 (Mar.).

*Primary Examiner*—James W. Davie
*Attorney, Agent, or Firm*—Leonard C. Suchyta; James W. Falk

[57] ABSTRACT

A diode laser (2) including multiple quantum wells (26) of AlGaInAs in either compressive or tensile strain and barrier layers (28), wherein the conduction band confines the electron preferably to at least 150 meV, or at least 135 meV, such that the diode laser is efficient and can operate for extended periods at elevated temperatures up to 85° C. and above.

20 Claims, 2 Drawing Sheets

STRAINED ALGAINAS QUANTUM-WELL DIODE LASERS

RELATED APPLICATION

This application is related to application Ser. No. 08/039,771, filed Mar. 30, 1993, now U.S. Pat. No. 5,381,434, issued Jan. 10, 1995.

FIELD OF THE INVENTION

The invention relates generally to semiconductor lasers. In particular, the invention relates to compound-semiconductor diode lasers having quantum wells that are mechanically strained.

BACKGROUND ART

Modern telephone and data networks require light sources that are compatible with the silica fiber now almost universally used as the transmission medium of such networks. In the recent past, efforts were concentrated on lasers having an emission wavelength near at 1.55 μm because of the minimum of optical absorption in silica at that wavelength. However, for very high-speed operation, particularly over relatively shorter distances, operation at 1.3 μm is desirable because the dispersion in silica goes through zero at that wavelength. Dispersion determines the rate of change of, among other quantities, the speed of propagation of light on the fiber as a function of wavelength. A low dispersion allows a very high digital data rate. Therefore, modern communication networks require light sources that emit at 1.3 μm, are inexpensive, and are robust.

It is generally believed that only diode lasers can fulfill the strict requirements placed on such light sources. A generic diode laser 2 is illustrated in FIG. 1. An active region 4 is sandwiched between p-type and n-type layers 6 and 7 which act both as the two sides of a diode and also as cladding layers that guide light parallel to and generally within the active region 4. When a power source 8 forward biases the diode 2 above its threshold current, the diode 2 lases and outputs light 9.

In U.S. patent application, Ser. No. 08/039,771, filed Mar. 30, 1993, now U.S. Pat. No. 5,381,434, which is incorporated herein by reference, we describe such a 1.3-μm diode laser based on the AlGaInAs material system. Zah et al. describe further details of this work in "High-Performance Uncooled 1.3-μm $Al_xGa_yIn_{1-x-y}$/InP Strained-Layer Quantum-Well Lasers for Subscriber Loop Applications," IEEE Journal of Quantum Electronics, vol. 30, no. 2, February, 1994, also incorporated by reference. In particular, the diode we developed before includes multiple quantum wells that are composed of AlGaInAs and that are biaxially compressively strained.

Such compressively strained AlGaInAs diode lasers offer many advantages, including operation at the elevated temperatures expected in the field, and their reliability appears to be adequate. However, strained materials have often been suspect because strain is a possible failure mechanism causing failures which could be detected after only long periods of time. Accordingly, it is advisable to investigate other possibilities than compressively strained AlGaInAs.

Bhat et al. have previously reported a preliminary version of a tensile-strain AlGaInAs quantum-well diode laser in "OMCVD growth of strained $Al_xGa_yIn_{1-x-y}As$ for low threshold 1.3 μm and 1.55 μm quantum well lasers," Proceedings of the Fourth International Conference on Indium Phosphide and Related Materials, Apr. 21–24, 1992, Newport, R.I., paper THD2, pp. 453–456. This diode laser had a single quantum well of 14.4-nm thickness. Its temperature response was not disclosed. It is now believed that the AlGaInAs quantum wells described in that paper contained excessive Al or were too wide to adequately confine the electrons sufficient for high-temperature operation. Further, we believe that their single quantum wells of AlGaInAs emitting at 1.3 and 1.55 μm insufficiently confined the electron carriers, had the wrong composition for temperature insensitivity, and had insufficient gain.

Two papers have described related lasers for use at 1.5 μm. Kasukawa et al. disclose a diode laser having a single tensile-strain GaInAs quantum well and AlGaInAs barriers in "Very low threshold current density 1.5 μm GaInAs/AlGaInAs graded-index separate-confinement-heterostructure strained quantum well laser diodes grown by organometallic vapor deposition." Applied Physics Letters, vol. 59, pp. 2486–2488, 1991. The tensile-strain laser had a characteristic temperature of 50° K., which is considered too low for the high-temperature environment of the local telephone loop. Stegmüller et al. also disclose a strained diode laser having multiple compressively strained GaInAs quantum wells and AlGaInAs barriers in "1.57 μm Strained-Layer Quantum-Well GaInAlAs Ridge-Waveguide Laser Diodes with High Temperature (130° C.) Ultrahigh-Speed (17 GHz) Performance." in IEEE Photonics Technology Letters, vol. 5, pp. 597–598, 1993. However, their diode lasers like those of Stegmüller et al., insufficiently confined the electron carriers, excessively varied with temperature, especially with respect to the quantum efficiency and threshold current, and had insufficient gain. It is not clear how to adapt this laser design for 1.3 μm. Their change in efficiency between 25° and 85° C. is large since they did not use the optimal barrier height and their barrier height does not conform to what we now believe to be the best.

SUMMARY OF THE INVENTION

The invention can be summarized as a laser diode based on the AlGaInAs/InP family of compound semiconductors and having at least one strained quantum well, either in biaxially tensile or compressive strain. Preferably, the band structure of the quantum well is engineered to provide about 150 meV of electron confinement energy. Thereby, the laser provides highly efficient output, little temperature dependence, and a wide modulation bandwidth.

DETAILED DESCRIPTION OF THE PREFERRED EMBODIMENTS

Figure 2:
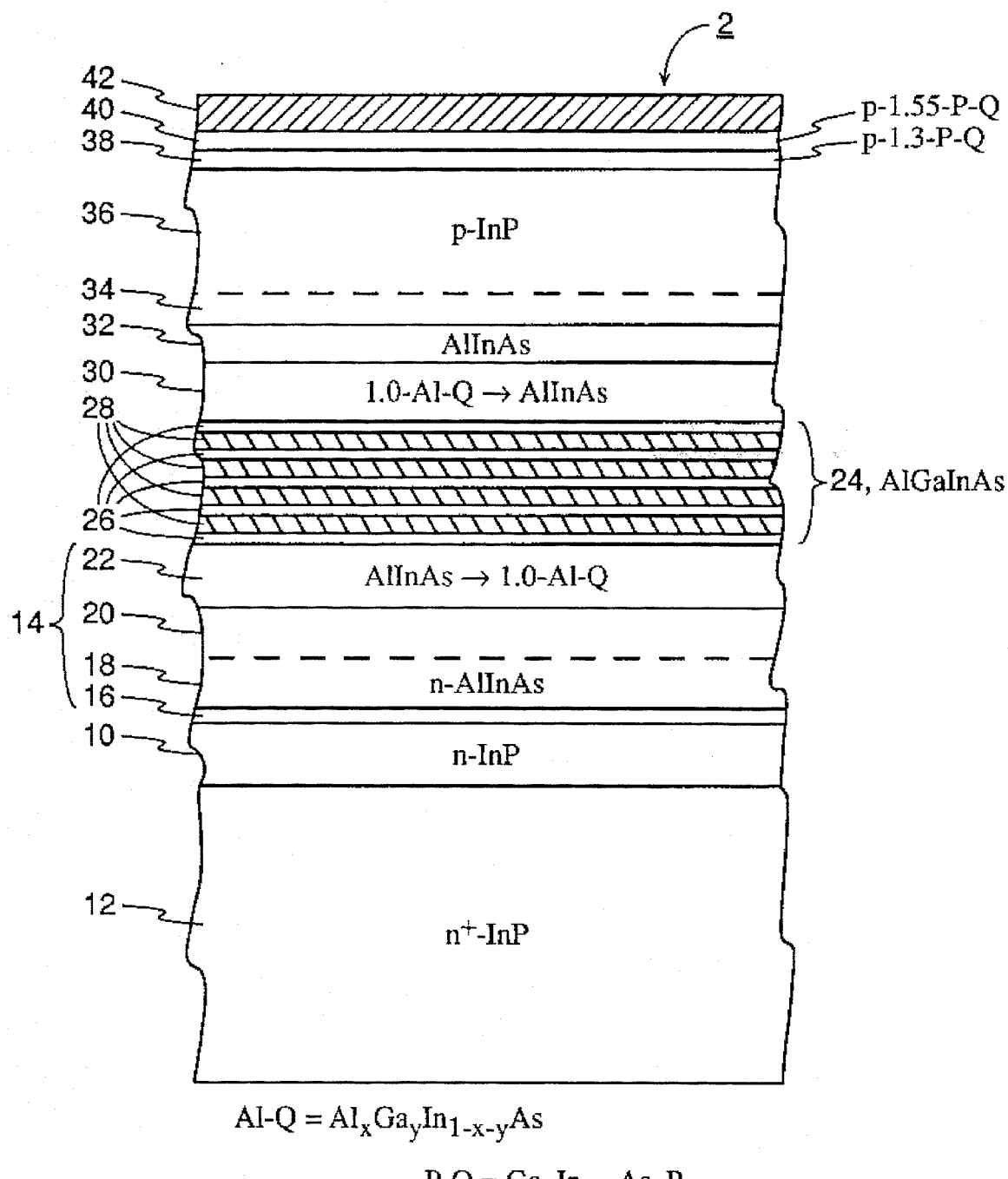
FIG. 2 is a cross-section of a diode laser of the invention.

The vertical structure of an embodiment of the present invention closely but not completely follows the cited parent patent application to Bhat et al., and that patent application should be consulted for most details. As illustrated in the cross section of FIG. 2, a lower cladding layer 10 of n-type InP is epitaxially grown on an $n^+$-type InP substrate 12. A lower transition region 14 includes an InP/AlInAs graded layer 16, two layers 18 and 20 of n-type InAlAs of decreasing doping, and a linearly graded confinement-to-barrier transition layer 22.

Over this is epitaxially grown the important AlGaInAs active layer 24 that includes one of more quantum-well layers 26 sandwiched between barrier layers 28. The quantum-well layers 26 and barrier layers 28 are both composed of AlGaInAs, though of differing alloying. This active layer 24 will be discussed later in more detail.

Thereafter, the structural sequence is reversed with a change in doping to provide the p-n junction of the laser diode 2. Over the active layer 24 is grown a linearly graded confinement layer 30 and an upper confinement layer 32 of AlInAs, followed by p-type upper cladding layers 34 and 36 of increasing doping. Finally, two layers 38 and 40 of GaInAsP are grown with decreasing bandgap, followed by a heavily doped GaInAs contact layer 42.

The operation of the lasers 2 of both the prior patent and the present invention depends heavily upon the details of the active layer 24.

Figure 1:
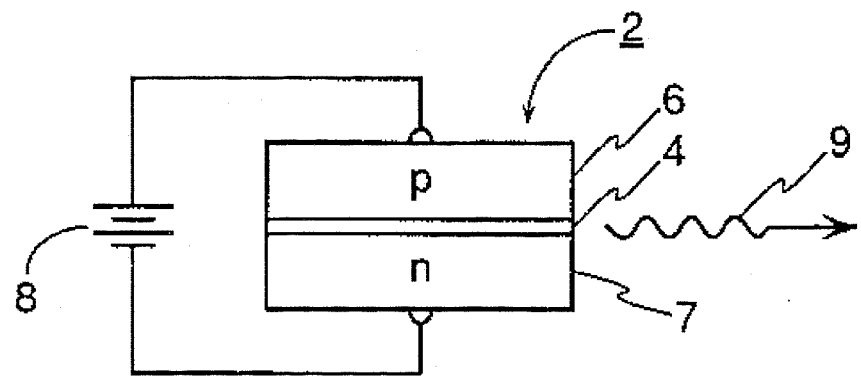
FIG. 1 is a cross-section of a generic diode laser.
Figure 3:
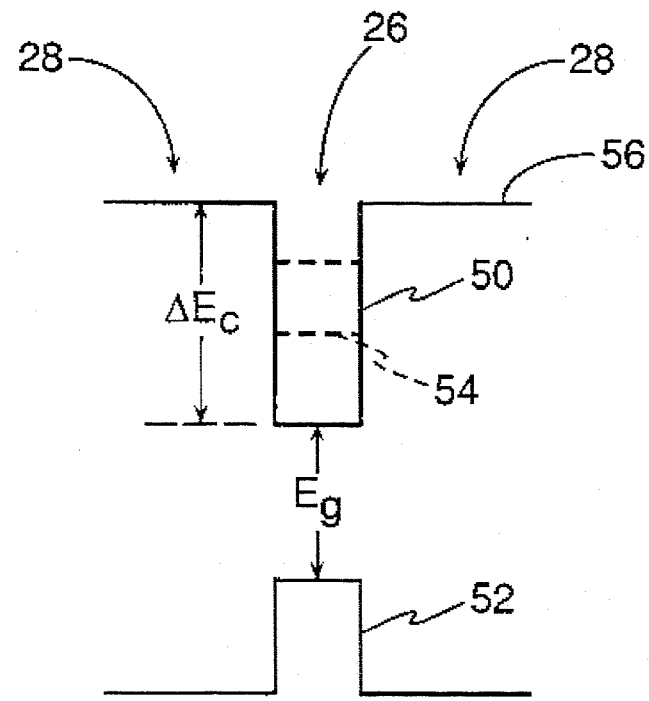
FIG. 3 is a schematic of the band structure of a quantum well in the diode laser of FIG. 2.

As Zah et al. describe in the above cited article, a high-performance laser requires that the laser not be significantly affected by temperature up to about 85° C. That article states that the high-temperature performance of a diode laser is degraded by the carrier leakage through the barrier layer, which can be reduced by stronger carrier confinement within the quantum well. The electron, since it has a lighter effective mass, requires a tighter confinement in the conduction band quantum well 50, illustrated generally in the energy band structure of FIG. 3, than the hole in the valence band quantum well 52. In a typical strained quantum-well diode, the quantum-well layer 26 containing the wells 50 and 52 is sandwiched between two barriers 28 that are lattice matched to the substrate, InP in this case. Unlike the more traditional GaInAsP/InP system, AlGaInAs/InP has a relatively large conduction band offset $\Delta E_c$ in which to confine the electron between the bulk conduction band and the bottom of the conduction quantum well. Moreover, because of relatively small lattice mismatch between GaAs and AlAs, it is relatively easy to tailor the bandgap at a given strain by only interchanging gallium and aluminum. For the $Al_xGa_yIn_{1-x-y}As/InP$ system, the amount of strain is given by TABLE 1, which may interpolated and extrapolated to other values from the listed values.

TABLE I

| COMPOSITION (1 − x − y) | STRAIN |
|---|---|
| 0.38 | 1% tensile |
| 0.53 | matched |
| 0.67 | 11% compressive |

At the Γ-point (k=0) in the band structure, either compressive or tensile strain separates the otherwise degenerate light and heavy electron or hole bands and thereby affects the energy bandgap $E_g$. In the AlGaInAs compositions of interest, compressive strain increases the bandgap while tensile strain decreases it. However, the compressive strain in AlGaInAs is obtained by increasing the indium mole fraction, and this increase in indium composition causes the bandgap to decrease more than the increase due to strain. Similarly, the tensile strain is obtained by decreasing the indium mole fraction which causes a larger increase than that due to strain. Thus, the overall effect is that compressive strain lowers the bandgap and tensile strain increases the bandgap. The bulk bandgap $E_g$ for these compositions of AlGaInAs is in toto given by $$E_g = \begin{cases} 0.79 + 1.568x, & 1\% \text{ tensile strain} \\ 0.75 + 1.548x, & \text{matched} \\ 0.638 + 1.532x, & 1\% \text{ compressive strain} \end{cases} \quad (1)$$

For a quantum well, the electron confinement energy is defined as the energy between the first quantization level 54 in the conduction well 50 and the conduction band edge 56 of the barrier layer 28. It depends upon the band offset $\Delta E_c$, well composition, well thickness, and barrier composition, and thus its value can be engineered. For GaInAsP/InP lasers, the electron confinement energy is usually lower than 100 meV; however, according to the invention, for AlGaInAs/InP lasers, the electron confinement energy can be increased to 150 meV. These values should be compared to the intended operating temperature of 85° C., which can be expressed in energy as 33 meV.

In one embodiment of the invention, both the quantum well and the barrier are composed of $Al_xGa_yIn_{1-x-y}As$ of differing values of x and y, but generally on the Al-lean side with x<50% and preferably with the Al-content of the quantum well being substantially less than that of the barrier.

We have derived a simple relation between the aluminum mole fraction $x_w$ in the well 26 and the aluminum mole fraction $x_{b,w}$ in the barrier 28 that satisfies the operating requirement of the AlGaInAs laser diode, namely, $$x_b = x_{b,w} + x_{b,s}, \quad (2)$$

where $x_{b,w}$ and $x_{b,s}$ are the quantum-well and strain terms $$x_{b,w} = \begin{cases} 0.25 + 0.93x_w, & 4\text{ nm} \\ 0.19 + 0.97x_w, & 8\text{ nm} \\ 0.17 + 0.98x_w, & 12\text{ nm} \end{cases} \quad (3)$$

where the three terms are for three particular values of the quantum-well thickness and $$x_{b,s} = \begin{cases} 0.05, & 1\% \text{ tensile strain} \\ 0, & \text{match, 0\% strain} \\ -0.05, & 1\% \text{ compressive strain} \\ -0.07, & 1.5\% \text{ compressive strain} \end{cases} \quad (4)$$

for the stated values of strain, where tensile and compressive strain are assigned opposite signs of strain. Both the quantum-well and strain terms can be linearly interpolated and extrapolated within the limits of the model.

In the material growth, once the well thickness and the strain are decided by design, the above relationship for the barrier composition $x_b$ is used to maintain the electron confinement energy while the bandgap wavelength of the quantum well (which is the energy difference between the lowest confined states of the conduction and valence bands) can be adjusted over a large wavelength range from 1.3 to 1.55 μm. By the use of these design rules, a laser diode can be easily designed in which the electron confinement energy has the desired value of 150±15 meV. Such a simple design procedure has not been discovered for the GaInAsP/InP material system.

However, a further design consideration is that the separation between the light hole and the heavy hole in the valence-band well should be maintained fairly large; but, the separation moves in opposite direction for increasing tensile strain and for decreasing well thickness (quantum size effect). Therefore, tensile-strain wells should be kept moderately thick, about 8 nm or more.

Two additional criteria should be satisfied in the laser design in order to minimize the temperature effects on the threshold current and the slope efficiency, viz.

$$G_0 > 4 \frac{T_{J_{tr}}}{T_{G_0}} (\alpha_i + \alpha_m) \quad (5)$$

and $$\alpha_i + \alpha_m > 4\Gamma\beta N_{th} \frac{T_{\eta_i}}{T_{N_{th}}}, \quad (6)$$

where J is the current density, $J_{tr}$ is the transparency current density, $G_0$ is the modal gain when G/J is maximum, $\alpha_i$ is the internal loss, $\alpha_m$ is the mirror loss corresponding to light output, $\Gamma$ is the optical confinement factor of the multiple quantum-well region, $T_x$ is the characteristic temperature of parameter X, $\beta$ is the intervalence-band absorption parameter, and $N_{th}$ is the carrier density at threshold so that $\beta N_{th}$ is the carrier density dependent optical loss due to free carrier and intervalence band absorption, and $\eta_i$ is the internal quantum efficiency. These conditions are discussed more fully in the previously cited paper by Zah et al., and they are easily satisfied for strained AlGaInAs lasers if a large number of quantum wells are used, the mirror losses are increased (although equation (5) suggests increasing mirror loss, equation (6) suggests decreasing it so that optimization between the two is required), and the total well thickness allowed by strain is maximized consistent with Equations (5) and (6).

EXAMPLE 1

A series of tensile-strain AlGaInAs diode lasers were fabricated in conformance with the invention. Their vertical structure and growth procedure generally followed the prior patent and the technical article of Zah et al. Their active layer consisted of three AlGaInAs quantum wells sandwiched between AlGaInAs barriers. Each quantum well had a composition of $Al_{0.007}Ga_{0.56}In_{0.453}As$ to produce a tensile strain of 0.98% and a thickness of 11 nm to produce a photoluminescently measured bandgap of $\lambda_g=1290$ nm. Each barrier had a composition of $Al_{0.317}Ga_{0.155}In_{0.527}As$ so as to be lattice-matched to InP and to be unstrained and a thickness of 10 nm to produce a bandgap of $\lambda_g=1000$ nm.

The epitaxially formed structure was formed into a ridge laser, as described in the prior patent application, and cleaved into lasers of various lengths. The rear facet was coated with an anti-reflection coating of 95% or better reflectivity while the front facet was left uncoated.

A 762-μm long laser lased at 25° C. in a single transverse mode near 1290 nm at an output power of 103 mW. Quantum efficiencies were better for shorter lasers and were in the range of 0.35–0.45 W/A. Differential quantum efficiency changed by about 0.63 dB when the heat-sink temperature changed from 25° to 100° C.

Further experimental results are given in TABLE II, which show an even smaller change in quantum efficiency between below room temperature and 85° C. for a diode laser with five compressively strained quantum wells, specifically less than −3 dB between 25° and 100° C. for some cavity lengths, typically −0.3 to −0.5 dB from 25° to 85° C.

TABLE II

| T °C. | $\eta_1$ % | $\alpha_i$ cm$^{-1}$ | $G_o$ cm$^{-1}$ | $G_o$/well cm$^{-1}$ | $J_{tr}$ kA/cm$^2$ | $J_{tr}$/well A/cm$^2$ |
|---|---|---|---|---|---|---|
| 15 | 61 | 5.4 | 36.4 | 12.1 | 0.513 | 171 |
| 65 | 59 | 8.8 | 31.7 | 10.6 | 0.840 | 280 |
| 85 | 59 | 10.9 | 28.9 | 9.63 | 0.964 | 321 |

A further advantage of the invention is the wide small-signal modulation linewidth. The strong carrier confinement also results in a small k-factor (0.25 ns or less), which indicates the applicability of the invention for high-speed modulation up to 35 GHz. This tensilely strained laser diode achieved a small-signal modulation bandwidth of at least 17 GHz at 110 mA bias current, as limited by heating.

It was originally thought that tensile-strain layers would not be stable for more than three such quantum wells because of strain relaxation by dislocation generation, as described by Vawter et al. in "Useful design relationships for the engineering of thermodynamically stable strained-layer structures," Journal of Applied Physics, vol. 65, pp. 4769–4773, 1989. However, we fabricated another series of such lasers which had six tensile-strain AlGaInAs quantum wells instead of three in the above presented example and with the same composition and thickness. The strained quantum layers did not relax, and the experimental results were comparable. Additional quantum wells are desired to increase the gain factor.

Work based upon the above invention was disclosed by Wang et al. in "High speed, Ultra Low Noise Operation from −40° C. to 100° C. Tensile Strained InGaAlAs MQW Lasers emitting at 1300 nm," 14th IEEE International Semiconductor Laser Conference, Sep. 19–23, 1994, Maui, Hi., USA.

EXAMPLE 2

The parent application gives the experimental results for compressively strained quantum wells, which are included within the broadest claim of the present invention. One slightly different experimental embodiment will be briefly described. It included five $Al_{0.161}Ga_{0.102}In_{0.737}As$ quantum wells of 5-nm thickness and in 1.43% compressive strain. The barriers were 10-nm thick and had a quaternary composition $Al_xGa_yIn_{1-x-y}As$ satisfying Equations (2), (3), and (4). Some data for the compressively stressed laser diode is given in TABLE III. In particular, the quantum efficiency decreased by no more than 8% between room temperature (25° C.) and 85° C., −0.63 dB between 25° and 100° C.

TABLE III

| T °C. | $\eta_1$ % | $\alpha_i$ cm$^{-1}$ | $G_o$ cm$^{-1}$ | $G_o$/well cm$^{-1}$ | $J_{tr}$ kA/cm$^2$ | $J_{tr}$/well A/cm$^2$ |
|---|---|---|---|---|---|---|
| 25 | 95 | 8.6 | 53.6 | 10.7 | 0.832 | 166 |
| 65 | 92 | 10.7 | 48.1 | 9.62 | 1.21 | 242 |
| 85 | 88 | 11.3 | 44.3 | 8.86 | 1.51 | 302 |

For the above exemplary compressive embodiment, the maximum bandwidth of 19.6 GHz is achieved at a bias current of 153 mA, which is limited by heating. The laser diode is capable of reaching 8.6 GHz at 85° C.

Numerous modifications may be made to the above embodiments without departing from the spirit of the invention. Different numbers of quantum wells can be used. The lasing wavelength can be chosen over a wide and useful range. The barriers for compressive-strain quantum wells may be tensilely strained to further aid the electron confinement, and vice versa. Furthermore, tensile-strain barriers allow a larger number of compressive-strain quantum wells to be grown, and vice versa.

Further elemental components can be added to the AlGaInAs. The quantum wells can be incorporated into other laser structures. It is understood that the cladding layers can act as barriers on the outside of the active layer.

The laser diode of the invention thus satisfies the requirements of the local loop and high-speed data networks. It can operate at elevated temperatures without cooling; but, nonetheless, lase intensely at the desired long wavelengths at high efficiency.

What is claimed is:

1. A diode laser comprising two cladding layers of opposite conductivity types on opposite sides of an active layer comprising at least one strained AlGaInAs quantum well layer sandwiched between barrier layers and having an electron confinement energy of at least 135 meV.

2. A diode laser as recited in claim 1, wherein the quantum well strain is tensile strain.

3. A diode laser as recited in claim 2, wherein there are more than three of quantum well layers.

4. A diode laser as recited in claim 2, wherein said barrier layers comprise AlGaInAs.

5. A diode laser as recited in claim 4, wherein the Al content of said quantum well layer is substantially less than the Al content of said barriers.

6. A diode laser as recited in claim 4, wherein the aluminum contents of said quantum well and barrier layers, a thickness of said quantum well, and said strain of said quantum well substantially satisfy Equations (2), (3), and (4).

7. A diode laser as recited in claim 6, further substantially satisfying Equation (5).

8. A diode laser as recited in claim 7 wherein the internal loss $\alpha_i$ is minimized so as to satisfy Equation (6).

9. A diode laser as recited in claim 1, wherein said quantum well layer has a thickness of less than 14 nm.

10. A diode laser as recited in claim 1, wherein an internal quantum efficiency degrades by no more than 10% between room temperature and 85° C.

11. A diode laser as recited in claim 2, wherein said quantum well layer has a thickness of less than 14 nm.

12. A diode laser as recited in claim 1, wherein said quantum well comprises substantially $Al_{0.007}Ga_{0.56}In_{0.453}As$ and said barriers comprise substantially $Al_{0.317}Ga_{0.155}In_{0.527}As$.

13. A diode laser as recited in claim 1, comprising a plurality of said quantum wells.

14. A diode laser as recited in claim 13, wherein said plurality of said quantum wells includes at least three of said quantum wells.

15. A diode laser as recited in claim 1, wherein said barrier layers have a strain of sign opposite to that of said quantum well layer.

16. A diode laser comprising two cladding layers of opposite conductivity types on respective sides of a quantum-well region comprising a plurality of tensile strained AlGaInAs quantum wells sandwiched by AlGaInAs barrier layers under strain, said diode laser usefully lasing at a temperature of 85° C. when a current is applied between said two cladding layers.

17. A diode laser as recited in claim 16, wherein said barrier layers strain is compressive strain.

18. A diode laser as recited in claim 16, wherein said barrier layers strain is tensile strain.

19. A diode laser as recited in claim 18, wherein said plurality of quantum wells comprises more than three of said quantum wells.

20. A diode laser as recited in claim 16, wherein said quantum wells confine electrons by at least 135 meV.

* * * * *